United States Patent
Ikezawa et al.

(10) Patent No.: US 7,239,022 B2
(45) Date of Patent: Jul. 3, 2007

(54) SENSOR DEVICE

(75) Inventors: Toshiya Ikezawa, Obu (JP); Masaaki Tanaka, Kariya (JP)

(73) Assignee: Denso Corporation, Kariya (JP)

( * ) Notice: Subject to any disclaimer, the term of this patent is extended or adjusted under 35 U.S.C. 154(b) by 66 days.

(21) Appl. No.: 11/063,855

(22) Filed: Feb. 24, 2005

(65) Prior Publication Data

US 2005/0199988 A1  Sep. 15, 2005

(30) Foreign Application Priority Data

Mar. 11, 2004 (JP) ............................. 2004-069025
Oct. 25, 2004 (JP) ............................. 2004-309615

(51) Int. Cl.
- H01L 23/48 (2006.01)
- H01L 23/52 (2006.01)
- H01L 29/40 (2006.01)
- H01L 23/29 (2006.01)

(52) U.S. Cl. ........................ 257/777; 257/792
(58) Field of Classification Search ......... 257/777–796
See application file for complete search history.

(56) References Cited

U.S. PATENT DOCUMENTS 6,542,374 B1  4/2003  Muramatsu et al.
6,986,933 B2 *  1/2006  Higashi ........................ 428/143
7,002,257 B2 *  2/2006  Tao et al. ..................... 257/787
2001/0055836 A1 * 12/2001  Kunda ......................... 438/108

FOREIGN PATENT DOCUMENTS

| JP | A-2002-5961 | 1/2002 |
|---|---|---|
| KR | 10-2000-007325 | 2/2000 |
| KR | 10-2002-65723 | 8/2002 |

OTHER PUBLICATIONS

Notice of Preliminary Rejection from Korean Patent Office issued on Apr. 28, 2006 for the corresponding Korean patent application No. 10-2005-0019129 (a copy and English translation thereof).

* cited by examiner

Primary Examiner—Cuong Nguyen
(74) Attorney, Agent, or Firm—Posz Law Group, PLC

(57) ABSTRACT

A sensor device includes a circuit chip and a sensor chip. The circuit chip has a bonding portion. The sensor chip is stacked on the bonding portion of the circuit chip. The circuit chip and the sensor chip are bonded by a film-type adhesive containing 91 ±3 weight % of polyimide with no filler.

8 Claims, 1 Drawing Sheet

SENSOR DEVICE

CROSS REFERENCE TO RELATED APPLICATIONS

This application is based on Japanese Patent Application No. 2004-69025 filed on Mar. 11, 2004 and Japanese Patent Application No. 2004-309615 filed on Oct. 25, 2004, the disclosures of which are incorporated herein by reference.

FIELD OF THE INVENTION

The present invention relates to a sensor device having a sensor chip, a circuit chip, and a film-type adhesive interposed therebetween.

BACKGROUND OF THE INVENTION

A conventional sensor device such as an acceleration sensor and/or an angular speed sensor includes a circuit chip with a bonding portion, a sensor chip stacked on the bonding portion of the circuit chip, and a film-type adhesive interposed between the circuit chip and the sensor chip.

In this type of conventional sensor device, a stack structure that mounts the sensor chip on top of the circuit chip is adopted in order to reduce manufacturing costs by minimizing an implementation size.

The adhesive that bonds an upper surface of the circuit chip and a lower surface of the sensor chip is a film-type polyimide adhesive containing an inorganic filler such as BN (boron nitride) or Ag (silver).

The film-type adhesive including filler is used to maintain both the binding strength of the circuit chip and the sensor chip, and the elasticity of the adhesive when the sensor is put in a high temperature environment.

However, the sensor chip attached on the circuit chip with the film-type adhesive including filler has the following problems according to a study conducted by the inventors of the present invention.

The film-type adhesive including a high density filler, e.g. approximately 10 weight %, tends to have lumps in the filler caused by cohesion. As a result, the lower side of the sensor chip damages the circuit chip by pressing the lumps in the filler against the surface of the circuit chip when the sensor chip is pressed against the circuit chip to be bonded thereto. The damage caused by the process may result in a decreased performance and malfunction of the circuit chip.

SUMMARY OF THE INVENTION

In view of the above-described problems, it is an object of the present invention to provide a sensor device having a sensor chip, a circuit chip, and an adhesive interposed therebetween and a method of manufacturing the sensor device without damaging the circuit chip.

In order to achieve the above object, the sensor device of the present invention has a structure where the sensor chip is stacked on a bonding portion of the circuit chip with the interposing film-type adhesive containing 91±3 weight % of polyimide with no filler.

In the film-type adhesive containing 91±3 weight % (i.e. 88 weight % to 94 weight %) of polyimide with no filler, formation of filler lumps caused by cohesion is prevented.

Therefore, the sensor chip can be attached to the circuit chip with the interposing film-type adhesive without causing damage to the surface/internal circuits of the circuit chip to manufacture the sensor device.

As a result, according to the present invention, the sensor device having the circuit chip with the sensor chip disposed thereon can be manufactured without causing damage to the circuit chip.

The reason for the density range of polyimide contained in the film-type adhesive being 91±3 weight % is based on the result of a study conducted by the inventors of the present invention.

When an amount of hardening ingredient other than polyimide in the film-type adhesive (e.g. epoxy) is not enough, the strength the adhesive as a mass becomes insufficient. When the amount of the hardening ingredient is too much, the surface bonding strength of the adhesive decreases in spite of the sufficient strength as a mass.

According to the study of the inventors, the hardening ingredient of the film-type adhesive is preferably in a weight percent range of 9±3 to maintain both the strength as a mass and the surface bonding strength. By experiments, the inventors confirmed that the adhesive provides the sufficient bonding strength.

Therefore, the film-type adhesive contains 9±3 weight % of the hardening ingredients, and thus the amount of polyimide, the rest of the ingredient, is in the range of 91±3 weight %.

The thickness of the adhesive in this invention is preferably 50 μm or less.

Other objects, features and advantages of the present invention will become more apparent from the following detailed description made with reference to the accompanying drawings, in which:

DETAILED DESCRIPTION OF THE PREFERRED EMBODIMENTS

The following is a description of an embodiment of the present invention with reference to the drawings.

Figure 1:
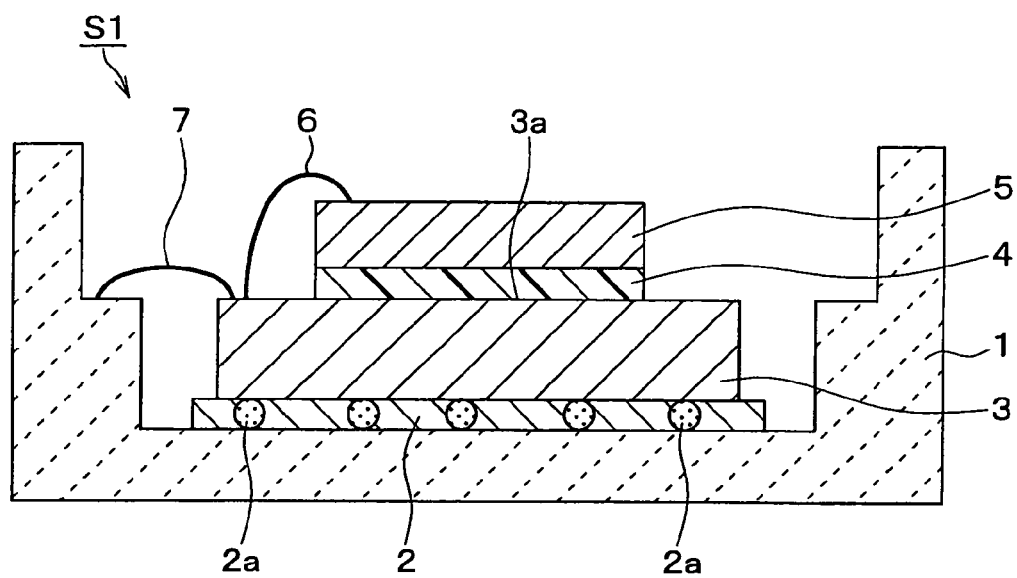
FIG. 1 is a cross-sectional side view of a sensor device according to an embodiment of the present invention.

A sensor device used as an acceleration sensor S1 is shown in FIG. 1 in cross-sectional view. The acceleration sensor S1 is, for example, used for an automotive air-bag device.

A ceramic package 1 is used as a base of the acceleration sensor S1 as well as an attachment used for attaching the sensor S1 at a suitable place for measurement (e.g. at a bottom of a driver's seat of a vehicle). The accelerator sensor S1 includes a circuit chip 3 disposed on the ceramic package 1. A liquid adhesive 2 made of a silicon-type resin is interposed between the ceramic package 1 and the circuit chip 3.

In this embodiment, the adhesive 2 contains beads 2a made of resin or the like. The beads 2a serve to establish the thickness of the adhesive 2 in order to level the upper surface of the circuit chip 3 relative to the ceramic package 1. In other words, the beads 2a act as a 'spacer.'

The circuit chip 3 is made from MOS transistors or bi-polar transistors formed on a silicon substrate by a well-known semiconductor manufacturing process. The circuit chip 3 has functions such as electric current processing for output.

An upper surface of the circuit chip 3 has a bonding portion 3a being reserved as an area for supporting a sensor chip 5. The sensor chip 5 stacks on the bonding portion 3a. A film-type adhesive 4 is interposed between the bonding portion 3a and the sensor chip 5. The film-type adhesive 4 is made of polyimide and includes no filler.

The film-type adhesive 4 has a thickness in a range between 10 to 50 μm in order to maintain sufficient elasticity. In a preferred embodiment, the film-type adhesive includes a thickness of approximately 20 μm.

If the thickness of the adhesive 4 is too thick (e.g. 100 μm), it becomes less elastic and easily deformable in high temperature environments.

Therefore, an impact applied to the vehicle during a collision or similar occurrence may be absorbed by the film-type adhesive 4 before reaching the sensor chip 5. This will result in an erroneous measurement of acceleration by the acceleration sensor S1. The upper limit of the thickness of the film-type adhesive 4 is, for that reason, determined to be 50 μm. The lower limit of the thickness is determined to be 10 μm based on a required bonding strength.

The film-type adhesive 4 in this embodiment contains 91±3 weight % of polyimide and 9±3 weight % of a hardening ingredient. In a preferred embodiment, the hardening ingredient includes epoxy.

The sensor chip 5 is used as an element that detects acceleration. The sensor chip 5 has, for example, a beam with a comb structure formed on a silicon substrate, being a well-known type, that detects a change of static capacitance (an electric signal) between moving electrodes and fixed electrodes proportional to an applied acceleration.

Bonding wires 6, 7 electrically connect the sensor chip 5 with the circuit chip 3 and the circuit chip 3 with the ceramic package 1, respectively. In a preferred embodiment, the bonding wires 6, 7 may be made of gold, aluminum, or any other suitable material.

The electric signal (a change in the static capacitance) from the sensor chip 5 is sent to the circuit chip 3 through the bonding wire 6. The circuit chip 3 converts the electric signal to a voltage signal (acceleration signal) by a C/V conversion circuit. The circuit chip 3 then outputs the signal to an electrode (not shown) on the ceramic package 1 through the bonding wire 7.

This electrode is electrically connected to an electrode on a reverse side of the ceramic package 1 through a hole (not shown). The ceramic package 1 may be, for example, made from a package having multiple ceramic layers stacked and connected by interposing conductors to form a circuit.

The electrode on the reverse side of the ceramic package 1 is further connected to an external circuit (not shown) such as an ECU. Through this connection, the acceleration sensor S1 outputs the acceleration signal to the external circuit.

In this case, a covering member (not shown) is disposed on the upper surface of the ceramic package 1 to seal the sensor chip 5 therein. The covering member protects the sensor chip 5 from humidity and mechanical stress.

A manufacturing process of the acceleration sensor S1 will now be explained.

The ceramic package 1 having the adhesive 2 disposed thereon is combined with the circuit chip 3. The adhesive 2 is then hardened. The adhesive 2 is prepared to contain the beads 2a for leveling the height of the circuit chip 3 by forming the adhesive 2 layer even.

Then, the circuit chip 3 is combined with the sensor chip 5. There are two methods available for combining the chips.

In one method, the sensor chip 5 is separated from a wafer with a dicing cutter after the film-type adhesive 4 is attached to the reverse side of the wafer. The separated sensor chip 5 is then picked up and mounted on the circuit chip 3.

In the second method, the sensor chip 5 is separated from the wafer with the dicing cutter to be combined with the film-type adhesive 4 being prepared in a size of the sensor chip 5. The sensor chip 5 and the film-type adhesive 4 are then orderly put on the circuit chip 3.

The sensor chip 5 and the circuit chip 3 with the interposing film-type adhesive 4 are combined by either of the two above-described methods. The film-type adhesive 4 is then heated indirectly by heating the ceramic package 1 and the circuit chip 3.

The sensor chip 5 is therefore bonded to the bonding portion 3a of the circuit chip 3 by hardening the film-type adhesive 4 with the sensor chip 5 being pressed against the circuit chip 3.

In this embodiment, the film-type adhesive 4 has no filler contained therein. That is, there is nothing to form lumps by cohesion. Therefore, the film-type adhesive 4 does not cause damage to the surface of the circuit chip 3 when the sensor chip 5 is bonded on the surface thereof.

Manufacture of the acceleration sensor S1 is then completed by wire-bonding the bonding wires 6, 7.

The acceleration sensor S1 in this embodiment is manufactured by bonding the circuit chip 3 and the sensor chip 5 using a film-type adhesive 4 having no filler. The film-type adhesive 4 can therefore be made 'lumpless.'

Therefore, the sensor chip 5 can be bonded to the circuit chip 3 without causing damage to the circuit chip 3 that would otherwise be caused by the film-type adhesive 4.

In other words, the circuit chip 3 is prevented from being damaged in the manufacturing process of the acceleration sensor S1 in the region where the sensor chip 5 is disposed.

The reason for limiting the content of polyimide in the film-type adhesive 4 within the range 91±3 weight % in this embodiment is as follows.

The film-type adhesive 4 used in this embodiment is, as described above, a mixture of polyimide as a main ingredient and a hardening ingredient such as epoxy.

The inventors examined the relationship between the content of the hardening ingredient and bonding strength of the film-type adhesive 4. The epoxy was used as the hardening ingredient and the bonding strength was measured as a 'peel strength.' 'Peel strength' refers to the strength required to resist a peeling force applied to the bonding portion.

The peel strength was measured at a temperature of 240° C. The size of the sensor chip 5, i.e. the size of the bonding area of the film-type adhesive 4, was 5 mm by 5 mm. The results of the experiment are shown in the graph of FIG. 2.

Figure 2:
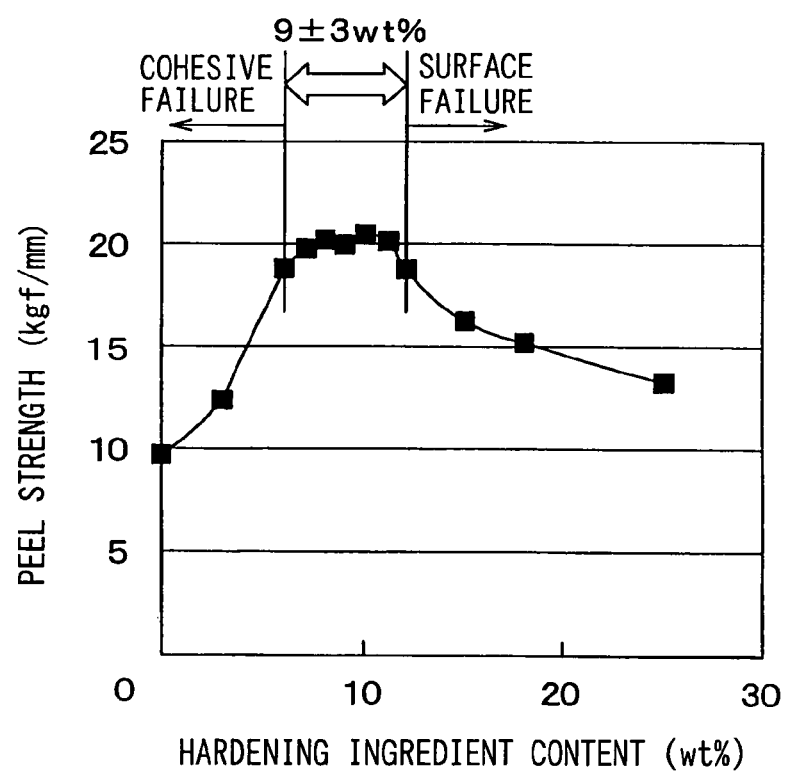
FIG. 2 is a graph illustrating a relationship between a hardening ingredient weight % and a 'peel strength' of a film-type adhesive of the sensor device of FIG. 1.

The graph of FIG. 2 shows the relationship between the content of the hardening ingredient (weight %) and the peel strength (kgf/mm) of the adhesive.

The peel strength of the film-type adhesive 4 is maintained when the content of the hardening ingredient falls in the range of 9±3 weight %, that is, between 6 weight % and 12 weight %. In other words, this condition of the film-type adhesive 4 provides sufficient bonding strength.

When the content of the hardening ingredient falls outside of the range of 9±3 weight %, the peel strength decreases steeply. The content of the hardening ingredient less than the above range causes cohesive failure. The content of the hardening ingredient more than the above range causes surface failure of the film-type adhesive 4.

This is because the film-type adhesive 4 does not have sufficient strength as a mass when the content of the hardening ingredient is less than the range of 9±3 weight %.

Furthermore, the film-type adhesive 4 does provide sufficient strength as a mass, but surface bonding strength becomes insufficient when the hardening ingredient is more than the above range.

The inventors confirmed by experiment that the film-type adhesive 4 can provide both the sufficient strength as a mass and the sufficient surface bonding strength when the hardening ingredient content is within the range of 9±3 weight %. As a result, the film-type adhesive 4 can provide sufficient bonding strength.

Based on the result of the experiments, the hardening ingredient content in the film-type adhesive 4 is limited within the range of 9±3 weight % and the content of the polyimide is limited within the range of 91±3 weight % in this embodiment.

The thickness of the film-type adhesive 4 in this embodiment is equal to or less than 50 μm, or more preferably equal to 20 μm.

The film-type adhesive 4 of this thickness works properly in terms of securely transferring the impact applied to the acceleration sensor S1 (i.e. the ceramic package 1) to the sensor chip 5 through the interposing circuit chip 3 and the film-type adhesive 4.

The film-type adhesive 4 is made of polyimide type material in this embodiment. This ensures sufficient bonding strength between the sensor chip 5 and the circuit chip 3.

Use of the film-type adhesive 4 instead of a liquid-type adhesive for bonding the sensor chip 5 on the bonding portion 3a of the circuit chip 3 protects the circuit chip 3 from contamination by bleeding of low-molecular weight content.

Contamination of the circuit chip 3 by bleeding more particularly means that the deteriorated wire-bonding dexterity and the like caused by contamination with the low-molecular weight content in the proximity of bonding portion 3a.

Although the acceleration sensor S1 is described as an example of the present invention, it is to be noted that the present invention may also be applicable to an angle speed sensor, a pressure sensor, a temperature sensor, or a light sensor.

That is, the sensor chip used in the sensor device of the above embodiment may also be an angle speed sensing element, a pressure sensing element, a temperature sensing element, or a light sensing element.

The circuit chip in the above embodiment may also be made from MOS transistors, bi-polar transistors, memory circuits, or any other circuit.

Although the film-type adhesive 4 is made of polyimide in the first embodiment, the material for the adhesive may also be epoxy, acrylic, or other similar material.

What is claimed is:

1. A sensor device comprising:
   a circuit chip having a bonding portion; and
   a sensor chip stacked on the bonding portion of the circuit chip, wherein
   the circuit chip and the sensor chip are bonded by a film-type adhesive containing 91±3 weight % of polyimide with no filler.

2. The sensor device of claim 1, wherein the thickness of the film-type adhesive is less than or equal to 50 μm.

3. The sensor device of claim 2, wherein the thickness of the film-type adhesive is approximately 20 μm.

4. The sensor device of claim 1, wherein the film-type adhesive includes 9±3 weight % a hardening ingredient.

5. The sensor device of claim 4, wherein the hardening ingredient includes epoxy.

6. The sensor device of claim 1, further comprising a package supporting the circuit chip and the sensor chip thereon.

7. The sensor device of claim 6, wherein an adhesive layer adheres the circuit chip to the package.

8. The sensor device of claim 7, wherein the adhesive layer includes beads that serve to level the circuit chip relative to the package.

* * * * *